United States Patent
Ji

(10) Patent No.: US 12,153,078 B2
(45) Date of Patent: Nov. 26, 2024

(54) METHOD OF ESTIMATING LIFETIME CONSUMPTION

(71) Applicant: Protean Electric Limited, Farnham (GB)

(72) Inventor: Chao Ji, Farnham (GB)

(73) Assignee: PROTEAN ELECTRIC LIMITED, Farnham (GB)

( * ) Notice: Subject to any disclaimer, the term of this patent is extended or adjusted under 35 U.S.C. 154(b) by 184 days.

(21) Appl. No.: 17/771,666

(22) PCT Filed: Oct. 22, 2020

(86) PCT No.: PCT/IB2020/059938
§ 371 (c)(1),
(2) Date: Apr. 25, 2022

(87) PCT Pub. No.: WO2021/079313
PCT Pub. Date: Apr. 29, 2021

(65) Prior Publication Data
US 2022/0373586 A1 Nov. 24, 2022

(30) Foreign Application Priority Data
Oct. 24, 2019 (GB) ........................ 1915468

(51) Int. Cl.
*G01R 31/00* (2006.01)
*G01R 31/34* (2020.01)

(52) U.S. Cl.
CPC ......... *G01R 31/007* (2013.01); *G01R 31/343* (2013.01)

(58) Field of Classification Search
CPC ................ G01R 31/007; G01R 31/343; G01R 31/2642; G01R 31/2601
See application file for complete search history.

(56) References Cited

U.S. PATENT DOCUMENTS

2010/0174576 A1\* 7/2010 Naylor ................... G06Q 10/04
706/54
2016/0155278 A1 6/2016 Nozawa et al.

FOREIGN PATENT DOCUMENTS

DE 102016203276 9/2016

OTHER PUBLICATIONS

M. Musallam, C. M. Johnson, C. Yin, C. Bailey and M. Mermet-Guyennet, "Real-time life consumption power modules prognosis using on-line rainflow algorithm in metro applications," 2010 IEEE Energy Conversion Congress and Exposition, Atlanta, GA, USA, 2010, pp. 970-977 (Year: 2010).\*
Öttl et al., Implementation of power semiconductor aging behavior in an electric vehicle powertrain model, 15th International Workshop on Research and Education in Mechatronics (REM), El Gouna, Egypt, 2014, pp. 1-6 (Year: 2014).\*

(Continued)

*Primary Examiner* — Daniel R Miller
(74) *Attorney, Agent, or Firm* — ALLEN DYER ET AL.

(57) ABSTRACT

A method and device estimate life consumption for an electronic component for use with an electric motor. The method and device allow maximal/minimal temperature values of semiconductor devices to be continuously monitored to allow on-cycle thermal damage and post-cycle damage to be determined in a parallel manner.

11 Claims, 5 Drawing Sheets

(56) References Cited

OTHER PUBLICATIONS

Z. Chen, F. Gao, C. Yang, T. Peng, L. Zhou and C. Yang, "Converter Lifetime Modeling Based on Online Rainflow Counting Algorithm," 2019 IEEE 28th International Symposium on Industrial Electronics (ISIE), Vancouver, BC, Canada, 2019, pp. 1743-1748 (Year: 2019).*
Musallam Mahera et al.; Mission Profile-Based Reliability Design and Real-Time Life Consumption Estimation in Power Electronics; IEEE Transactions on Power Electronics, Institute of Electrical and Electronics Engineers, USA; vol. 30, No. 5, May 31, 2015; pp. 2601-2613.
Ni Ze et al.; Review of SiC MOSFET based three-phase inverter lifetime prediction, 2017 IEEE Applied Power Electronics Conference and Exposition (APEC), IEEE, Mar. 26, 2017; pp. 1007-1014.
Hirschmann D. et al; Reliability Prediction for Inverters in Hybrid Electrical Vehicles; IEEE Transactions on Power Electronics, Institute of Electrical Electronics Engineers, USA; vol. 22, No. 6; Nov. 30, 2007; pp. 2511-2517.
Musallam M. et al.; An Efficient Implementation of the Rainbow Counting Algorithm for Life Consumption Estimation; IEEE Transactions on Reliability, IEEE Service Center, Piscataway, NJ, US, vol. 61, No. 4; Dec. 31, 2012; pp. 978-986.
International Search Report and Written Opinion; PCT/IB2020/059938; European Patent Office; Feb. 1, 2021; entire document.

* cited by examiner

METHOD OF ESTIMATING LIFETIME CONSUMPTION

CROSS-REFERENCE TO RELATED APPLICATIONS

This application is the § 371 National Stage Entry of International Application No. PCT/IB2020/059938, filed on Oct. 22, 2020, which claims the benefit of GB Application No. 1915468.1, filed on Oct. 24, 2019, the contents of which applications are herein incorporated by reference in their entirety.

FIELD OF THE INVENTION

The present invention relates to a method for estimating lifetime consumption, in particular a method for estimating lifetime consumption for semiconductor devices for vehicle applications.

BACKGROUND OF THE INVENTION

With increased interest being placed in environmentally friendly vehicles there has been a corresponding increase in interest in the use of electric motors for providing drive torque for electric vehicles.

Electric motors work on the principle that a current carrying wire will experience a force when in the presence of a magnetic field. When the current carrying wire is placed perpendicular to the magnetic field the force on the current carrying wire is proportional to the flux density of the magnetic field. Typically, in an electric motor the force on a current carrying wire is formed as a rotational torque.

Examples of known types of electric motor include the induction motor, brushless permanent magnet motor, switched reluctance motor and synchronous slip ring motor, which have a rotor and a stator, as is well known to a person skilled in the art.

Typically a power electronic system, which for example may include an inverter, is used to control current flow within an electric motor, thereby controlling the generation of drive torque by the electric motor. However, the operation of the electric motor can imposed thermo mechanical effects on semiconductor devices within the power electronic system, where due to the differences in the coefficient of thermal expansion and mechanical stiffness of the materials inside the power electronic system generates thermal deformation (i.e. thermal loading) that can cause fatigue and function failure.

However, as a result of the unpredictable working environment and complex and irregular operating conditions of an electric vehicle, the temperature profiles/load conditions of semiconductor devices within a power electronic system are typically variable and unpredictable.

In order to effectively assess the cumulative fatigue damage, different cycle counting algorithms, such as level-crossing counting, simple-range counting, peak counting and rain-flow counting etc., have been used in applications subject to random and complex load conditions. These counting methods are particularly useful in the data analysis as a spectrum of varying load can be grouped into a set of simple uniform data histograms which allows the application of Miner's rule to be used for the fatigue life assessment.

Based on measured thermal data, the corresponding fatigue damage caused by a load profile on the semiconductor devices within the power electronic system can be assessed numerically to predict the remaining life of the power electronic system.

Of the different cycle counting algorithms, the rain flow counting method developed by T Endo and M Matsuishi in 1968 has become widely used for reliability analysis, where the rain flow counting uses a rule for pairing local minima and maxima to produce equivalent load cycles.

Typically all the thermal related data, such as ambient, coolant, and semiconductor junction temperatures etc., is continuously monitored throughout one entire cycle, and is recorded in a storage device. However, due to the need to pair local minima and maxima to produce equivalent load cycles, typically the identification of local minima and maxima can only be performed once the drive cycle for the electric motor has finished. Consequently, the corresponding lifetime consumption, or remaining lifetime, can only be updated after a complete load cycle.

However, a disadvantage of using this approach is that, one, a large volume data storage device is required to record the data of the whole drive cycle, and second, the lifetime prediction can only be refreshed after each cycle is completed.

To address these problems another technique has been proposed that utilises a stack implementation in which successive extremal values are compared with previous values through a recursive algorithm to identify the equivalent full and half cycles of the load profile on semiconductor devices resulting from thermo-mechanical stress occurring during a drive cycle. This approach is capable of offering a real-time lifetime consumption estimation with smaller data storage requirements. However, this technique can result in errors in the lifetime consumption estimation as a consequence of maximal/minimal values not being counted resulting from incomplete data.

It is desirable to improve this situation.

SUMMARY OF THE INVENTION

In accordance with an aspect of the present invention there is provided a method and device for estimating life consumption for an electronic component for use with an electric motor.

The present invention provides the advantage of allowing maximal/minimal temperature values of semiconductor devices to be continuously monitored to allow on-cycle thermal damage and post-cycle damage to be determined in a parallel manner, thereby allowing for greater accuracy with real-time monitoring capability. Additionally, the hardware storage device for storing the measured thermal/load data can be reduced.

The present invention will now be described, by way of example, with reference to the accompanying drawings, in which:

DETAILED DESCRIPTION OF PREFERRED EMBODIMENTS

The embodiment of the invention described is for a method of estimating lifetime consumption for an electronic component for use with an electric motor. For the purposes of the present embodiment the electric motor is for use in a wheel of a vehicle, where the electric motor includes an integrated power module having an inverter for controlling current flow within the electric motor. Preferably, the motor is for providing drive for a vehicle. However the electric motor may be used for any purpose and when located in a vehicle may be located anywhere within the vehicle. The motor is of the type having a set of coils being part of the stator for attachment to a vehicle, radially surrounded by a rotor carrying a set of magnets for attachment to a wheel. For the avoidance of doubt, the various aspects of the invention are equally applicable to an electric generator having the same arrangement. As such, the definition of electric motor is intended to include electric generator.

Figure 1:
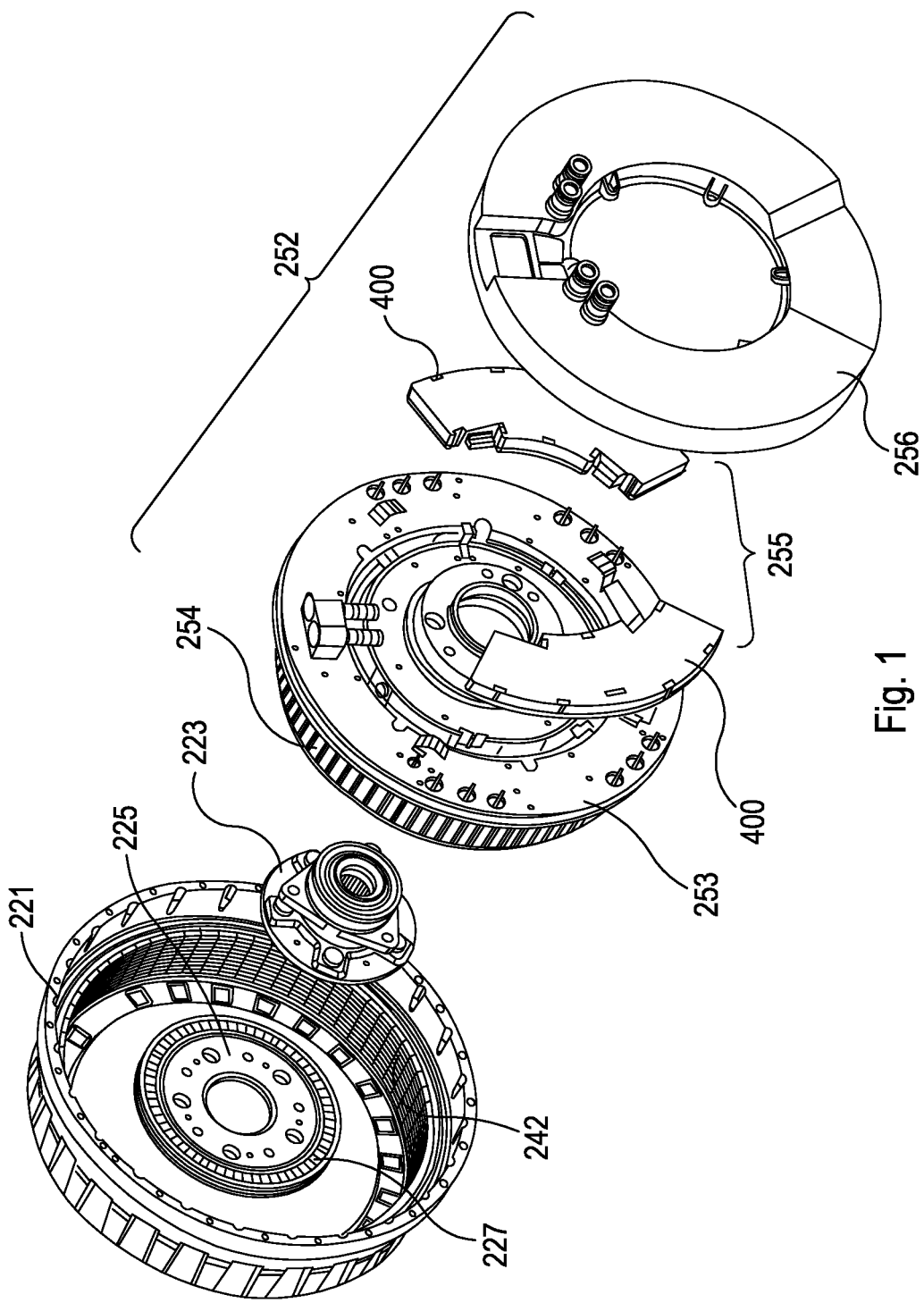
FIG. 1 illustrates an exploded view, from a first perspective, of a drive arrangement according to an embodiment of the present invention.

For the purposes of the present embodiment, as illustrated in FIG. 1, the in-wheel electric motor includes a stator 252 comprising a heat sink 253, multiple coils 254 and an electronics module 255 mounted in a rear portion of the stator for driving the coils. The coils 254 are formed on stator tooth laminations to form coil windings, as described below. A stator cover 256 is mounted on the rear portion of the stator 252, enclosing the electronics module 255 to form the stator 252, which may then be fixed to a vehicle and does not rotate relative to the vehicle during use.

Figure 3:
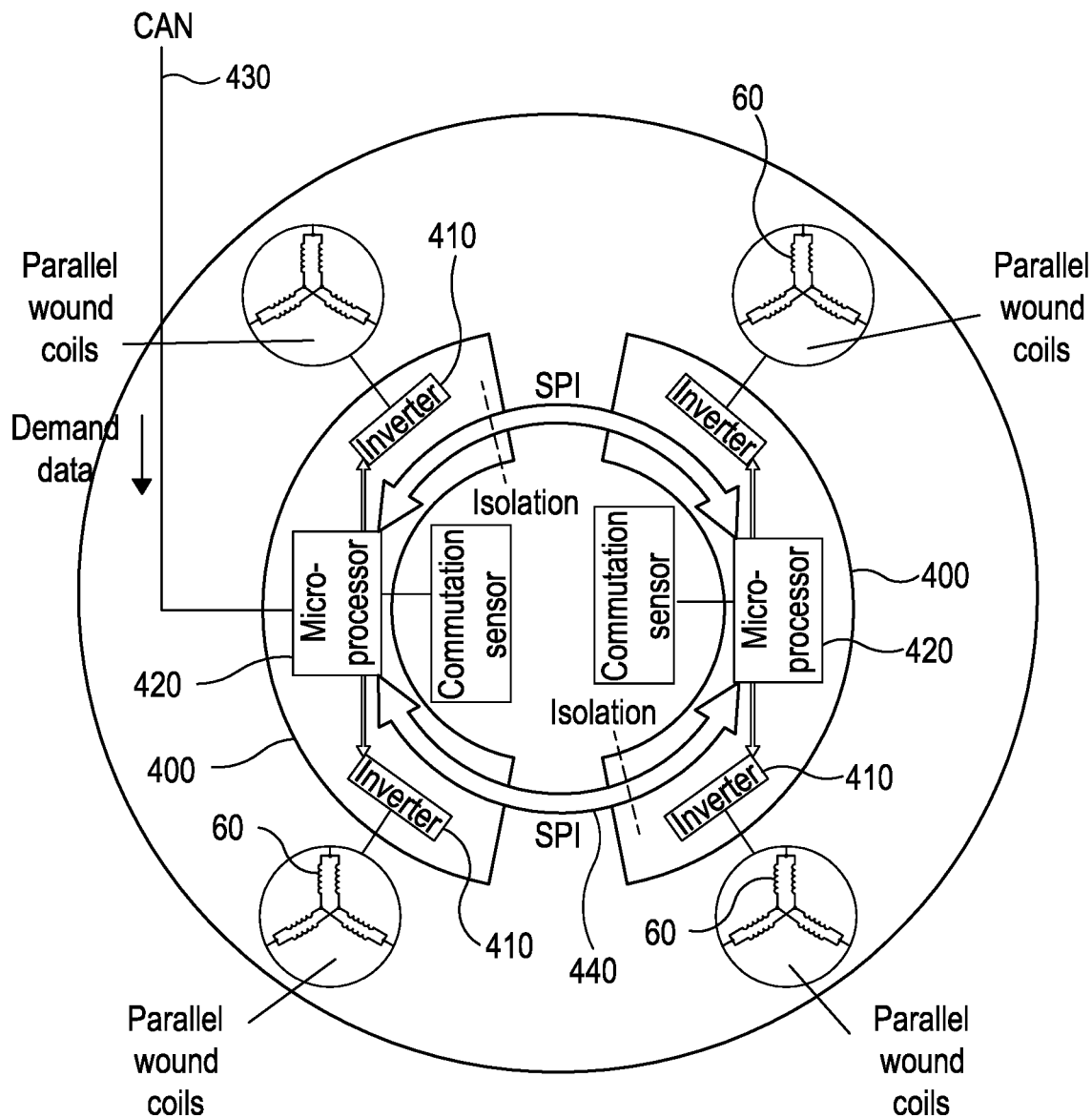
FIG. 3 illustrates a control device according to an embodiment of the present invention.

The electronics module 255 includes two control devices 400, where each control device 400 includes two inverters 410 and control logic 420, which in the present embodiment includes a processor, for controlling the operation of both inverters 410, as illustrated in FIG. 3. Although in the present embodiment the electronics module 255 includes two control devices, equally the electronics module 255 may include a single control device or more than two control devices.

A rotor 240 comprises a front portion 220 and a cylindrical portion 221 forming a cover, which substantially surrounds the stator 252. The rotor includes a plurality of permanent magnets 242 arranged around the inside of the cylindrical portion 221. For the purposes of the present embodiment 32 magnet pairs are mounted on the inside of the cylindrical portion 221. However, any number of magnet pairs may be used.

The magnets are in close proximity to the coil windings on the stator 252 so that magnetic fields generated by the coils interact with the magnets 242 arranged around the inside of the cylindrical portion 221 of the rotor 240 to cause the rotor 240 to rotate. As the permanent magnets 242 are utilized to generate a drive torque for driving the electric motor, the permanent magnets are typically called drive magnets.

The rotor 240 is attached to the stator 252 by a bearing block 223. The bearing block 223 can be a standard bearing block as would be used in a vehicle to which this motor assembly is to be fitted. The bearing block comprises two parts, a first part fixed to the stator and a second part fixed to the rotor. The bearing block is fixed to a central portion 253 of the wall of the stator 252 and also to a central portion 225 of the housing wall 220 of the rotor 240. The rotor 240 is thus rotationally fixed to the vehicle with which it is to be used via the bearing block 223 at the central portion 225 of the rotor 240. This has an advantage in that a wheel rim and tyre can then be fixed to the rotor 240 at the central portion 225 using the normal wheel bolts to fix the wheel rim to the central portion of the rotor and consequently firmly onto the rotatable side of the bearing block 223. The wheel bolts may be fitted through the central portion 225 of the rotor through into the bearing block itself. With both the rotor 240 and the wheel being mounted to the bearing block 223 there is a one to one correspondence between the angle of rotation of the rotor and the wheel.

Figure 2:
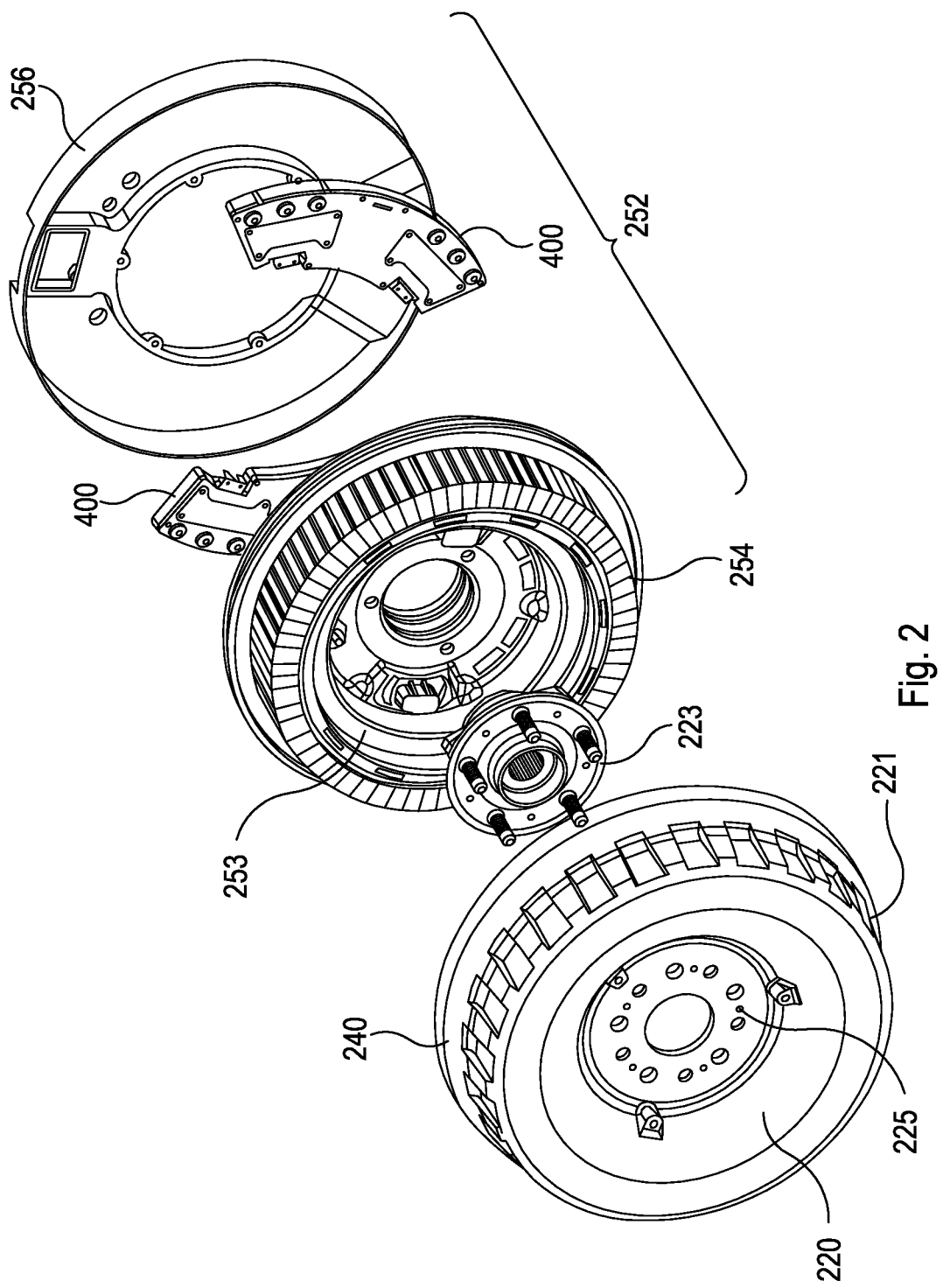
FIG. 2 illustrates an exploded view, from a second perspective, of a drive arrangement according to an embodiment of the present invention.

FIG. 2 shows an exploded view of the same assembly as FIG. 1 from the opposite side showing the stator 252 and rotor. The rotor 240 comprises the outer rotor wall 220 and circumferential wall 221 within which magnets 242 are circumferentially arranged. As previously described, the stator 252 is connected to the rotor 240 via the bearing block at the central portions of the rotor and stator walls.

A V shaped seal is provided between the circumferential wall 221 of the rotor and the outer edge of the stator.

The rotor also includes a set of magnets 227 for position sensing, otherwise known as commutation magnets, which in conjunction with sensors mounted on the stator allows for a rotor flux angle to be estimated. The rotor flux angle defines the positional relationship of the drive magnets to the coil windings. Alternatively, in place of a set of separate magnets the rotor may include a ring of magnetic material that has multiple poles that act as a set of separate magnets.

To allow the commutation magnets to be used to calculate a rotor flux angle, preferably each drive magnet has an associated commutation magnet, where the rotor flux angle is derived from the flux angle associated with the set of commutation magnets by calibrating the measured commutation magnet flux angle. To simplify the correlation between the commutation magnet flux angle and the rotor flux angle, preferably the set of commutation magnets has the same number of magnets or magnet pole pairs as the set of drive magnet pairs, where the commutation magnets and associated drive magnets are approximately radially aligned with each other. Accordingly, for the purposes of the present embodiment the set of commutation magnets has 32 magnet pairs, where each magnet pair is approximately radially aligned with a respective drive magnet pair.

A sensor, which in this embodiment is a Hall sensor, is mounted on the stator. The sensor is positioned so that as the rotor rotates each of the commutation magnets that form the commutation magnet ring respectively rotates past the sensor.

As the rotor rotates relative to the stator the commutation magnets correspondingly rotate past the sensor with the Hall sensor outputting an AC voltage signal, where the sensor outputs a complete voltage cycle of 360 electrical degrees for each magnet pair that passes the sensor.

For improved position detection, preferably an associated second sensor is placed 90 electrical degrees displaced from the first sensor.

The motor 40 in this embodiment includes four coil sets 60 with each coil set 60 having three coil sub-sets that are coupled in a wye configuration to form a three phase sub-motor, resulting in the motor having four three phase sub-motors. A first control device is coupled to two coil sets with a second control device being coupled to the other coil sets, where each inverter in the respective control devices is arranged to control current in a respective coil set. However, although the present embodiment describes an electric motor having four coil sets 60 (i.e. four sub motors) the motor may equally have two or more coil sets with associated control devices (i.e. two or more sub motors). For example in a preferred embodiment the motor 40 includes eight coil sets 60 with each coil set 60 having three coil sub-sets that are coupled in a wye configuration to form a three phase sub-motor, resulting in the motor having eight three phase sub-motors.

FIG. 3 illustrates the connections between the respective coil sets 60 and the control devices 400 housed in the electronics module 255, where a respective coil set 60 is connected to a respective three phase inverter 410 included on a control device 400. As is well known to a person skilled in the art, a three phase inverter contains six switches, where a three phase alternating voltage may be generated by the controlled operation of the six switches.

As stated above, the electronics module 255 includes two control devices 400, with each control device 400 having two inverters 410 that are coupled to a coil set 60. Additionally, each control device 400 includes an interface arrangement, where in a first embodiment the interface arrangement on each control device 400 is arranged to allow communication between the respective control devices 400 housed in the electronics module 255 via a communication bus with one control device 400 being arranged to communicate with a vehicle controller mounted external to the electric motor. The processor 420 on each control device 400 is arranged to handle communication over the interface arrangement.

The processors 420 on the respective control devices 400 are arranged to control both inverters 410 mounted in the respective control device 400 to allow each of the electric motor coil sets 60 to be supplied with a three phase voltage supply, thereby allowing the respective coil sub-sets to generate a rotating magnetic field. Although the present embodiment describes each coil set 60 as having three coil sub-sets the present invention is not limited by this and it would be appreciated that each coil set 60 may have one or more coil sub-sets.

Under the control of the respective processors 420, each three phase bridge inverter 410 is arranged to provide pulse width modulation PWM voltage control across the respective coil sub-sets, thereby generating a current flow in the respective coil sub-sets for providing a required torque by the respective sub-motors.

As stated above, PWM switching is used to apply an alternating voltage to the electric motors coil windings, where the amplitude of the voltage applied across the coil windings is dependent upon the rotor speed. The torque applied to the rotor results from phase current within the coil windings, where motor torque is a function of the amplitude of the phase current and the phase angle.

As stated above, PWM control works by using the motor inductance to average out an applied pulse voltage to drive the required current into the motor coils. Using PWM control an applied voltage is switched across the motor windings. During the period when voltage is switched across the motor coils, the current rises in the motor coils at a rate dictated by their inductance and the applied voltage. The PWM voltage control is switched off before the current has increased beyond a required value, thereby allowing precise control of the current to be achieved.

For a given coil set 60 the three phase bridge inverter 410 switches are arranged to apply a single voltage phase across each of the coil sub-sets.

The inverter switches can include semiconductor devices such as metal oxide semiconductor field effect transistors, MOSFETs, or insulated gate bipolar transistors, IGBTs. In the present example, the switches comprise IGBTs. However, any suitable known switching circuit can be employed for controlling the current. One well known example of such a switching circuit is the three phase bridge circuit having six switches configured to drive a three phase electric motor. The six switches are configured as three parallel sets of two switches, where each pair of switches is placed in series and form a leg of the three phase bridge circuit.

Preferably, a vehicle controller is arranged to transmit a torque demand request to the control devices 400 over a controller area network, CAN, bus 430. The torque demand request transmitted over the CAN bus 430 corresponds to the torque that the electric motor is required to generate based upon a drivers input, for example based on a throttle demand generated within the vehicle.

To allow temperature profiles to be obtained for the respective semiconductor devices within the control devices, the respective control devices incorporate means for measuring/estimating the temperature of the semiconductor devices, for example the junction and/or core temperature of the semiconductor devices. Examples of different mechanisms for measuring/estimating the temperature of the semiconductor devices include thermistors, thermocouples and resistance temperature detectors (RTDs), however any means for measuring/estimating the temperature may be used.

Having access to temperature information allows lifetime consumption estimation for the respective semiconductor devices to be performed, as described below, where during each operational drive cycle for an electric motor the system continuously monitors the maximal/minimal temperature values of the semiconductor devices and vehicle ambient. An in-line coding algorithm, which uses a stack-based implementation and a recursive algorithm, is used to identify full and half load cycles during the operational drive cycle.

An operation drive cycle for an electric motor will typically correspond to an operational period for the electric motor, for example the duration an electric motor is used to drive a vehicle from a first location to a second location. In other words, the duration corresponding to an electric motor performing a specific operation.

Figure 4:
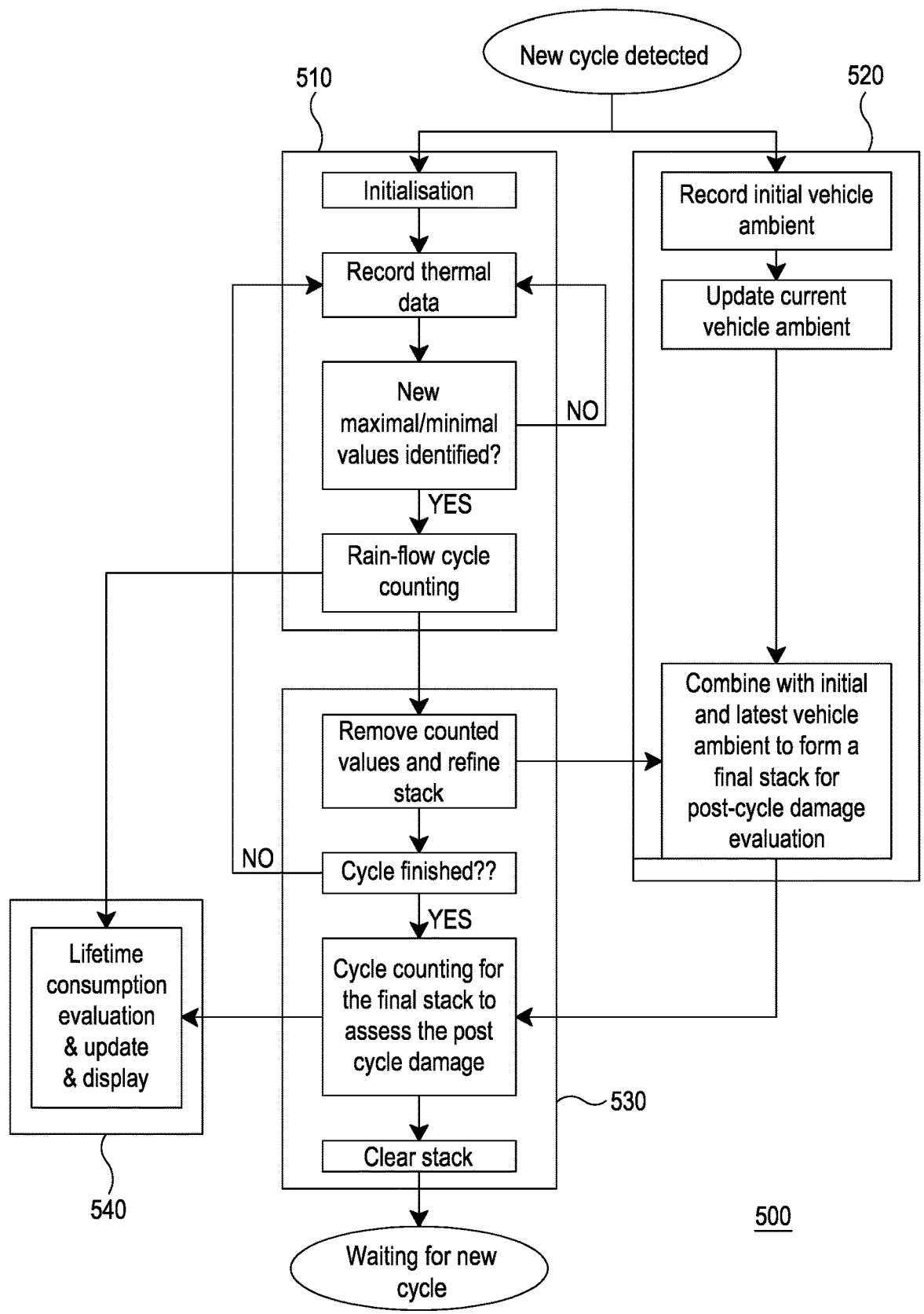
FIG. 4 illustrates a lifetime consumption estimation system according to an embodiment of the present invention.

An embodiment of a system for estimating lifetime consumption will now be described with reference to FIG. 4, where the estimating lifetime consumption system 500 includes an on-cycle damage evaluation block 510, a stack management block 520, a post-cycle damage evaluation block 530 and a lifetime consumption monitoring block 540. Preferably the functions of the on-cycle damage evaluation block 510, the stack management block 520, the post-cycle damage evaluation block 530 and the lifetime consumption monitoring block 540 are executed using a processer incorporated within one of the control devices 400. However, the functions for performing lifetime consumption estimation may be performed remote to the semiconductor devices for which the lifetime consumption estimation is being performed. Equally, the functionality of the respective blocks may be combined.

The on-cycle damage evaluation block 510 is arranged to identify local maximal/minimal temperature values in a real time manner, where the on-cycle damage evaluation block 510 carries out a counting algorithm, for example the rain-flow algorithm developed by T Endo and M Matsuishi in 1968, to assess if any complete, or half, thermal cycles have been formed by the recorded thermal data.

To allow the on-cycle damage evaluation block 510 to perform this task, when a new operational drive cycle is detected by the life consumption estimation system 500, the initial conditions of the vehicle are examined and recorded, which may include system remaining lifetime, coolant status, local time and weather condition etc. The temperature of the respective semiconductor devices, for example the junction temperature of the semiconductor devices, or the initial temperature from the IGBT temperature sensor, is monitored/estimated, as described above.

As a result of the counting algorithm performed by the on-cycle damage evaluation block 510 being performed in real time, it is not possible to preorder the recorded data. To overcome this problem the on-cycle damage evaluation block 510 is arranged to define two flexible sized buffers for processing the recorded maximal and minimal temperature values, where the recorded maximal temperature values are stored in one buffer and the recorded minimal temperature values are stored in the other buffer.

Every time a new local maximal/minimal temperature value is identified, for example using a 3 point counting rule, the on-cycle damage evaluation block 510 stores the temperature value in the respective buffer and carries out a counting algorithm, for example the rain-flow algorithm, to assess if any complete, or half, thermal cycle have been identified from the recorded thermal data, otherwise known as a full or half load cycle. Alternatively, the assessment of whether any complete, or half, thermal cycles have been identified may be performed prior to the new local maximal/minimal temperature value being stored in a buffer, where the new local maximal/minimal temperature value may be stored in the respective buffer after the assessment has been completed, if appropriate.

The recursive algorithm uses both the minimum and maximum temperature values stored in the respective stacks to identify full and half load/temperature cycles.

For purposes of illustration, an example for identifying a complete, or half, thermal cycle in real time using one buffer for storing maximum temperature values and a second buffer for storing minimum temperature values will be described.

For a detected maximum temperature, if the respective buffer already has a stored existing maximum temperature value, the new maximum temperature value is compared with the stored value, as described above, otherwise the new value will become the first value in the buffer/stack.

If the new maximum temperature value is greater than the first maximum temperature value in the buffer/stack, then the buffer/stack for minimum temperature values is checked for saved values. If one minimum value exists, then a half load cycle is identified, where the temperature variation for the half cycle will be the absolute value of the difference between this minimum value and the old maximum one.

The old maxim value is then removed from the maxima buffer/stack by replacing it with the new temperature value.

Alternatively, if there is more than one temperature value in the minima buffer/stack, a full load cycle is identified, where the temperature variation for the full cycle will be the absolute value of the difference between the new minimum value and the old maximum one. In this case, the old maximum temperature value and the new temperature minimum value will be removed from the respective buffer/stack.

In the scenario where a new maxima temperature value is smaller than the previous stored maxima temperature value, the new temperature value will be saved in the maxima buffer/stack with the previously stored maxima temperature value. If the maxima buffer/stack contains more than one temperature value the whole operation will be repeated recursively.

Similarly, when a new minimum temperature value is identified, the new temperature value is compared with the first value in the minima buffer/stack.

If the new minimum temperature value is less than the previously stored minimum temperature value, the maxima buffer/stack is checked for saved values.

If only one maximum value exists, a half cycle is identified, where the temperature variation for the identified half cycle is the absolute value of the difference between the maximum value and the previously stored minimum one.

The old minimum value will then be removed from the minima stack by replacing it with the new temperature value.

If it is indicated that there is more than one value in the maxima buffer/stack, then a full cycle is identified, where the absolute difference is the difference between the new maximum temperature value and the previously stored minimum temperature value.

In this case, the previously stored minimum temperature value and the new maximum temperature value are removed from their respective buffer/stack.

In the case of having a new minima temperature value that is greater than the previously stored temperature value, the new temperature value is stored in the minima buffer/stack alongside the previously stored minimum temperature value.

If the minima stack contains more than one value the whole operation will be repeated recursively.

As a consequence the respective buffer sizes vary dynamically depending on the values of the recorded maximum and minimum temperature values. For example, sequences of extremal values that reduce in absolute value will lead to an increase in buffer/stack size. Conversely, the buffer/stack size reduces when extremal values of magnitude larger than the smallest value stored in the stack are encountered.

Any leftover maximal/minimal values that have not been counted during the operation drive cycle are passed to the stack management block 520 once the operation drive cycle has finished, which are stored in a buffer/stack associated with the stack management block 520, as described below.

The initial conditions for the respective buffers/stacks may be defined in any suitable way, for example the buffers/stacks may be initialized with the first two extremal values, one maximum value, and one minimum value. Alternatively the buffers/stacks may be initialize with artificial values that are larger, in absolute terms, than the highest expected maximum or lowest expected minimum values.

The full/half cycles identified by the on-cycle damage evaluation block 510 are provided to the lifetime consumption monitoring block 540 to allow the lifetime consumption monitoring block 540 to evaluate the corresponding damage caused and consequently the life time consumption for the respective semiconductor devices during the recorded operation drive cycle, as described below.

The stack management block 520 is arranged to identify complete, or half, thermal cycles not identified by the on-cycle damage evaluation block 510 during the operational drive cycle.

To allow the stack management block 520 to perform this task, when a new operational drive cycle is detected by the life consumption estimation system 500, the stack management block 520 is arranged to record the initial ambient temperature of the vehicle, for example the initial junction temperature of the semiconductor devices within the respective control devices 400.

The value of the initial ambient temperature of the vehicle is saved as the first value of a maximal or minimal temperature value buffer associated with the stack management block 520. Preferably the stack management block 520 buffers correspond to the same buffers used by the on-cycle damage evaluation block 510, however, the stack management block 520 may have a separate maximal and minimal temperature value buffers.

Additionally, the stack management block 520 is arranged to continuously monitor the ambient temperature of the vehicle during the operational drive cycle and stores this value as the last value of one of the buffers associated with the stack management block 520.

The leftover maximal/minimal values that have not been counted by the on-cycle damage evaluation block 510 are received by the stack management block 520 and stored in the buffer/stack for the stack management block 520, in addition to the first and last ambient temperature values of the vehicle, as described above. The stored temperature values (i.e. the first and last ambient temperature and leftover maximal/minimal values) are passed from the stack management block 520 to the post-cycle damage evaluation block 530.

The post-cycle damage evaluation block 530 is arranged to analyze temperature values received from the stack management block 520 to identify any missing complete, or half, thermal cycles not identified by the on-cycle damage evaluation block 510. For example, as final ambient temperature value is only available after the operational duty cycle has finished the on-cycle damage evaluation block 510 will typically not have access to this information, thereby resulting in missing complete, or half, thermal cycles not identified by the on-cycle damage evaluation block 510.

The lifetime consumption monitoring block 540 receives thermal cycle information from the on-cycle damage evaluation 510 and post-cycle damage evaluation block 530 and evaluates the corresponding lifetime consumption using the identified thermal cycles received from both blocks.

Figure 5:
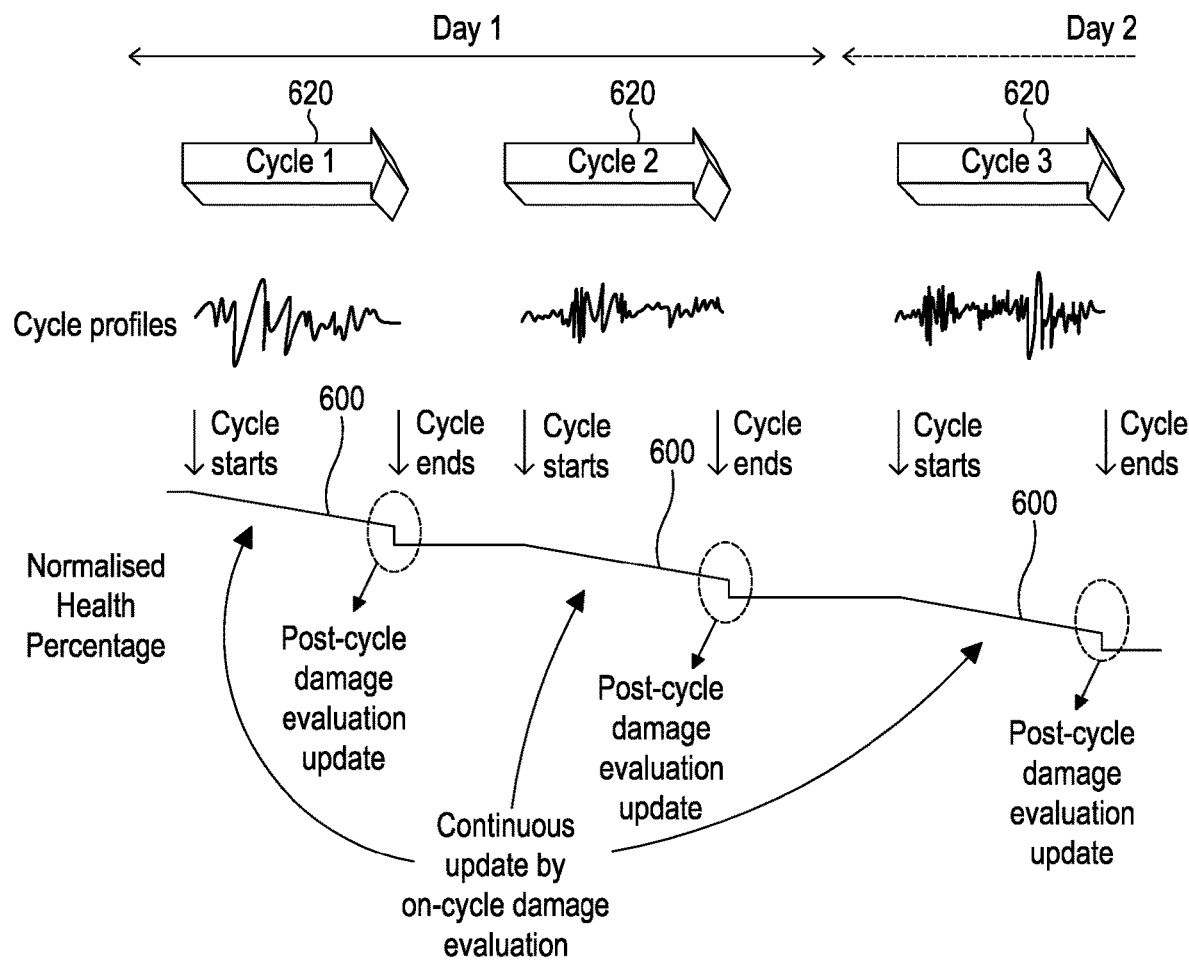
FIG. 5 illustrates a typical lifetime consumption estimation performed by a lifetime consumption estimation system according to an embodiment of the present invention.

FIG. 5 illustrates a typical lifetime consumption estimation performed by the lifetime consumption estimation system 500 described above. As described above, the lifetime consumption estimation system continuously monitors the maximal/minimal temperature values of the respective semiconductor devices and vehicle ambient and deals with the on-cycle thermal damage 600, which is performed in real time during an operational drive cycle 620, and post-cycle damage 610, which is performed after an operational drive cycle 620 has been completed, in a parallel manner, so that standard counting rules can be followed which guarantees a great accuracy with a real-time monitoring capability while reducing storage requirements.

The invention claimed is:

1. A method for operating an electronics module estimating life consumption of an electronic component for use with an electric motor, and comprising a control device having a respective processor, the method comprising:
   identifying a beginning of an operational drive cycle for the electric motor by the control device;
   measuring an operational parameter for the electronic component by the control device during the operational drive cycle and after the operational drive cycle has finished,
   wherein during the period of the operational drive cycle of the electric motor identifying a change in direction of the measured value of the operational parameter by the control device;
   determining by the processor whether the change in direction of the measured value of the operational parameter corresponds to a maximum value or minimum value,
   wherein if a change in direction in the measured value of the operational parameter corresponds to a maximum value, the maximum value is placed in a first buffer and if the measured value of the operational parameter corresponds to a minimum value, the minimum value is placed in a second buffer,
   wherein as each maximum value or minimum value is identified the respective values are compared with previous maximum and/or minimum values stored in the first buffer and second buffer respectively to identify a full load cycle or half load cycle of the electronic component,
   wherein for each identified full load cycle and half load cycle the stored maximum and/or minimum values used to identify the full and/or half load cycle are removed from the respective buffers;
   identifying an end of the operational drive cycle for the electric motor by the control device,
   wherein following identification of the end of the drive cycle a final operational parameter value is determined and in conjunction with maximum values and minimum values remaining in the respective first buffer and second buffer any remaining full load cycles and/or half load cycles for the electronic component are identified by the processor; and
   estimating by the processor a life consumption value associated with the operational drive cycle for the electronic component based on full load cycles and half load cycles identified during the operational drive cycle and identified after the operational drive cycle has finished based on the determined final operational parameter value.

2. The method according to claim 1, wherein the operational parameter is a temperature of the electronic component and/or a load condition of the electronic component.

3. The method according to claim 2, where in the temperature of the electronic component is a junction temperature and/or core temperature of the electronic component.

4. The method according to claim 1, wherein upon identifying the beginning of an operational drive cycle conditions associated with the electric motor are stored.

5. The method according to claim 4, wherein the stored conditions include a temperature of the electronic components, and/or a local time, and/or a location of the electric motor.

6. The method according to claim 1, wherein a change in direction of the measured value of the operational parameter is determined using a three point rule.

7. The method according to claim 1, wherein each identified maximum and/or minimum value is compared with previously stored maximum and/or minimum values stored in the first buffer and second buffer respectively using a counting algorithm.

8. The method according to claim 7, wherein the counting algorithm is a rain-flow algorithm.

9. The method according claim 7, wherein the counting algorithm is arranged to identify a full load cycle and/or a half load cycle.

10. A vehicle comprising:
   an electronics module interfacing with an electric motor and the electronics module comprising:
   a control device, the control device configured to perform the following:
      identify a beginning of an operational drive cycle for the electric motor, measure an operational parameter for an electronic component of the electric motor during the operational drive cycle and after the operational drive cycle has finished, wherein during the period of the operational drive cycle of the electric motor identify a change in direction of the measured value of the operational parameter; and a processor, the processor configured to perform the following:

determine whether the change in direction of the measured value of the operational parameter corresponds to a maximum value or minimum value, wherein if a change in direction in the measured value of the operational parameter corresponds to a maximum value, the maximum value is placed in a first buffer and if the measured value of the operational parameter corresponds to a minimum value, the minimum value is placed in a second buffer, wherein as each maximum value or minimum value is identified the respective values are compared with previous maximum and/or minimum values stored in the first buffer and second buffer respectively to identify a full load cycle or half load cycle of the electronic component, wherein for each identified full load cycle and half load cycle the stored maximum and/or minimum values used to identify the full and/or half load cycle are removed from the respective buffers, wherein following identification of an end of the drive cycle a final operational parameter value is determined and in conjunction with maximum values and minimum values remaining in the respective first buffer and second buffer any remaining full load cycles and/or half load cycles for the electronic component are identified, and estimate a life consumption value associated with the operational drive cycle for the electronic component based on full load cycles and half load cycles identified during the operational drive cycle and identified after the operational drive cycle has finished based on the determined final operational parameter value.

11. An electronics module interfacing with an electric motor and comprising:

a control device, the control device configured to perform the following:

identify a beginning of an operational drive cycle for the electric motor, measure an operational parameter for an electronic component of the electric motor during the operational drive cycle and after the operational drive cycle has finished, wherein during the period of the operational drive cycle of the electric motor identify a change in direction of the measured value of the operational parameter; and a processor, the processor configured to perform the following:

determine whether the change in direction of the measured value of the operational parameter corresponds to a maximum value or minimum value, wherein if a change in direction in the measured value of the operational parameter corresponds to a maximum value, the maximum value is placed in a first buffer and if the measured value of the operational parameter corresponds to a minimum value, the minimum value is placed in a second buffer, wherein as each maximum value or minimum value is identified the respective values are compared with previous maximum and/or minimum values stored in the first buffer and second buffer respectively to identify a full load cycle or half load cycle of the electronic component, wherein for each identified full load cycle and half load cycle the stored maximum and/or minimum values used to identify the full and/or half load cycle are removed from the respective buffers, wherein following identification of an end of the drive cycle a final operational parameter value is determined and in conjunction with maximum values and minimum values remaining in the respective first buffer and second buffer any remaining full load cycles and/or half load cycles for the electronic component are identified, and estimate a life consumption value associated with the operational drive cycle for the electronic component based on full load cycles and half load cycles identified during the operational drive cycle and identified after the operational drive cycle has finished based on the determined final operational parameter value.

* * * * *